United States Patent [19]

Boyle et al.

[11] Patent Number: 4,718,065
[45] Date of Patent: Jan. 5, 1988

[54] IN-LINE SCAN CONTROL APPARATUS FOR DATA PROCESSOR TESTING

[75] Inventors: Richard F. Boyle, San Jose; Leonard E. Overhouse, Los Gatos, both of Calif.

[73] Assignee: Tandem Computers Incorporated, Cupertino, Calif.

[21] Appl. No.: 845,918

[22] Filed: Mar. 31, 1986

[51] Int. Cl.$^4$ .............................................. G01R 31/28
[52] U.S. Cl. ........................................ 371/25; 371/27
[58] Field of Search ...................... 371/15, 16, 25, 27; 324/73 R, 73 AT

[56] References Cited

U.S. PATENT DOCUMENTS

| | | | |
|---|---|---|---|
| 4,326,290 | 4/1982 | Davis | 371/25 X |
| 4,513,418 | 4/1985 | Bardell | 371/15 X |
| 4,534,028 | 8/1985 | Trischler | 371/25 |
| 4,575,674 | 3/1986 | Bass | 324/73 R |
| 4,602,210 | 7/1986 | Fasang | 371/15 X |

Primary Examiner—Jerry Smith
Assistant Examiner—Robert W. Beausoliel, Jr.
Attorney, Agent, or Firm—Townsend and Townsend

[57] ABSTRACT

Apparatus is disclosed for generating pseudo-random bit patterns that are applied to a data processor, or other digital logic unit, for test purposes. In accordance with the invention, certain of the elemental storage units (e.g., flipflops) of the data processor are designed for two-mode operation: A normal mode of operation during which they operate as a part of the data processor in normal fashion, and a scan mode operation during which the elemental storage units respond to scan control signals to form a number of shift register or scan line configurations for receiving the pseudo-random sequenced or non-random sequenced test patterns generated by the apparatus. During testing, the bit patterns are passed through the scan line configurations and applied to compression circuits where, using cyclic redundancy checking (CRC), compression bit patterns received from the scan lines are achieved. Produced are test signatures that are stored in a memory for later comparison with standardized signatures to determine the PASS/FAIL condition of the processor. Tests can be preceded and followed by a controlled scan of the digital logic to save and restore the operational state of the digital logic. In this manner, test interruptions are relatively unobtrusive and essentially transparent to the logic tested.

11 Claims, 10 Drawing Figures

FIG.—1.

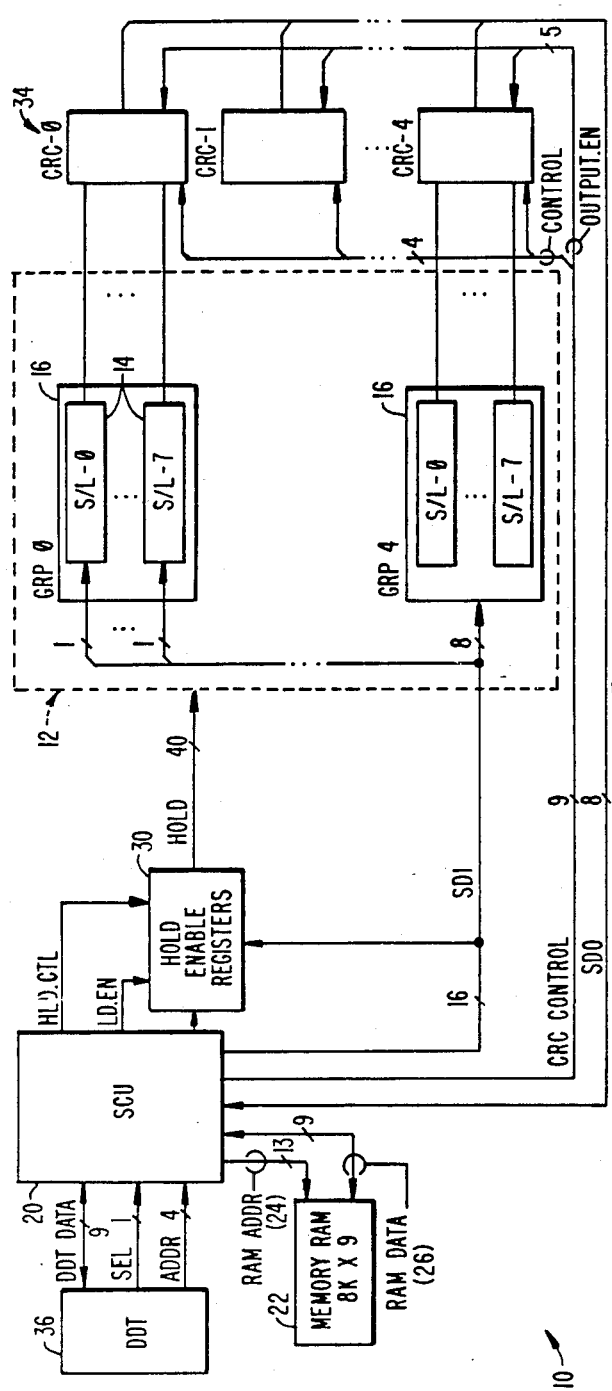
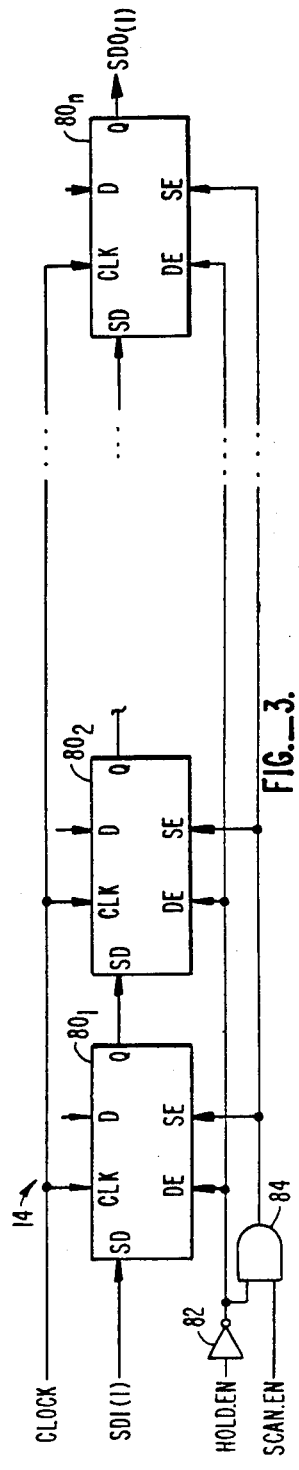
FIG.—1.
FIG.—3.

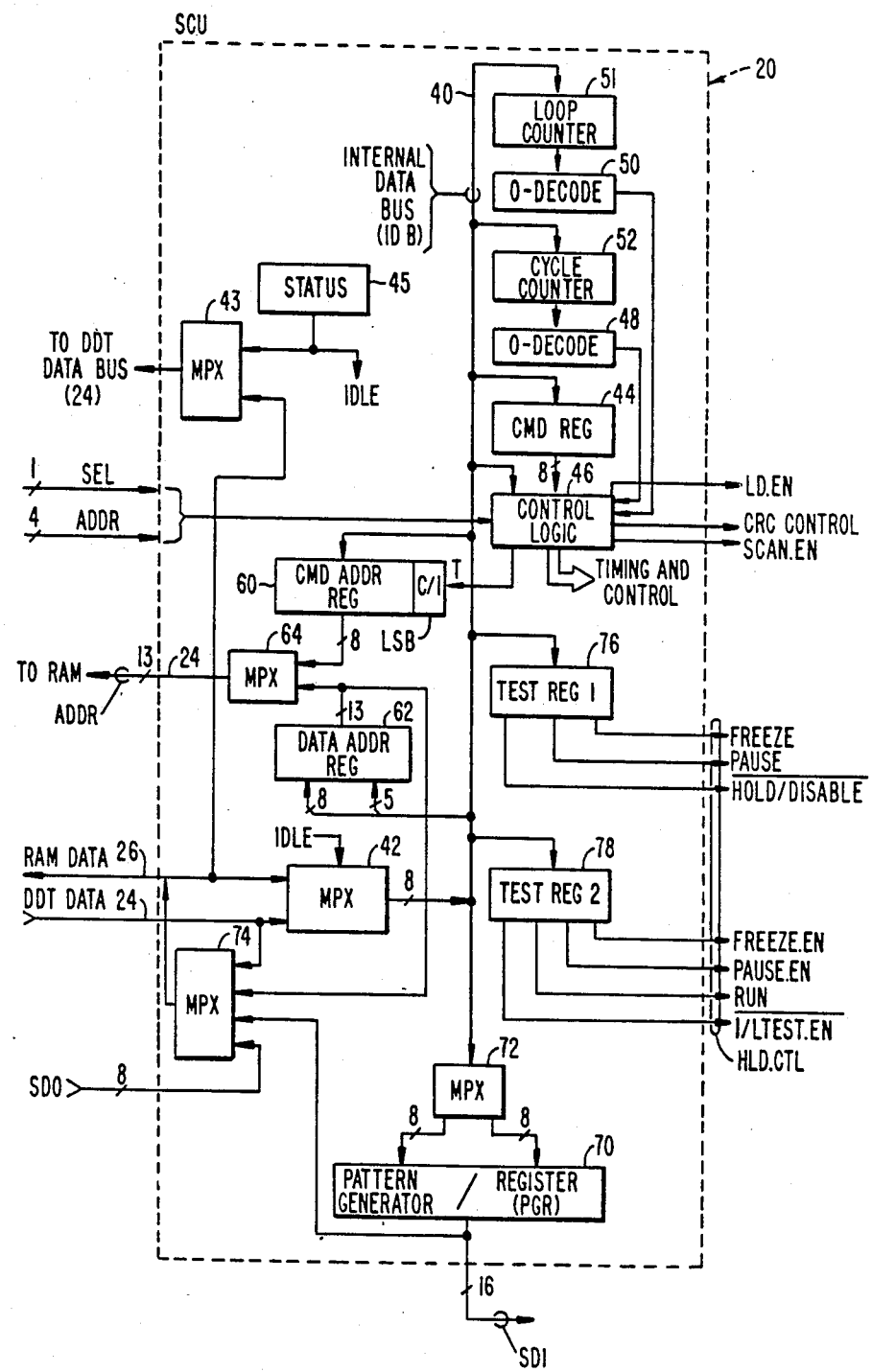
FIG._2.

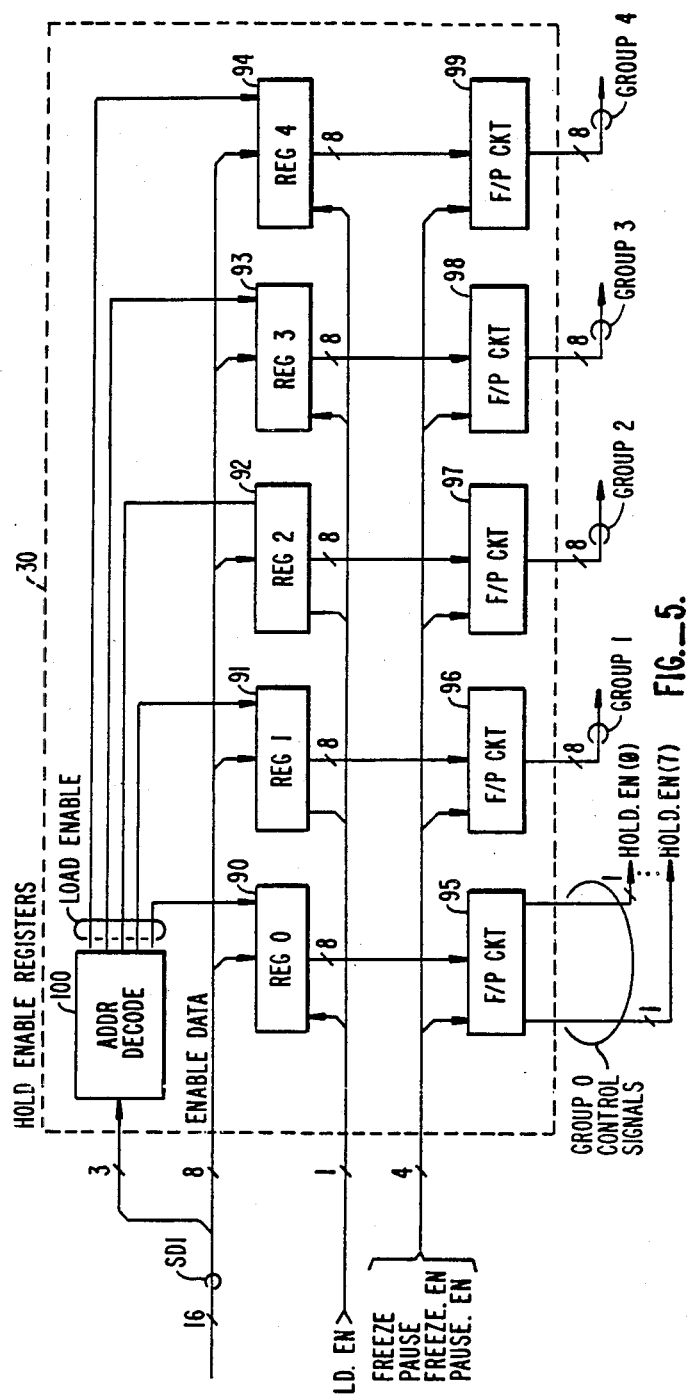
FIG._4.
FIG._5.

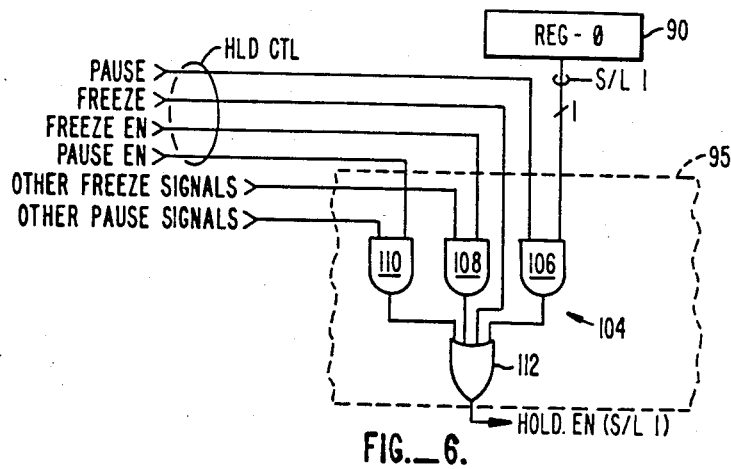
FIG._6.
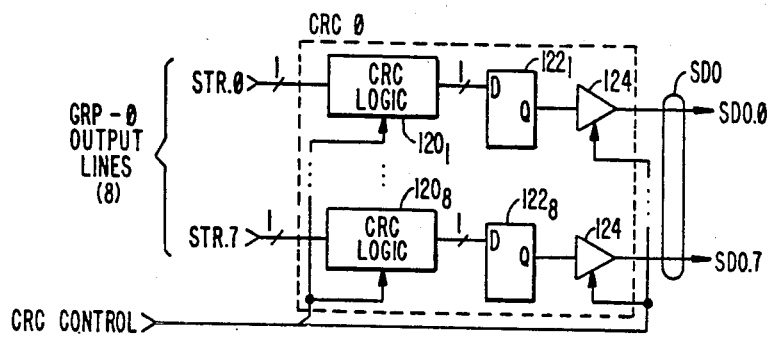
FIG._7.
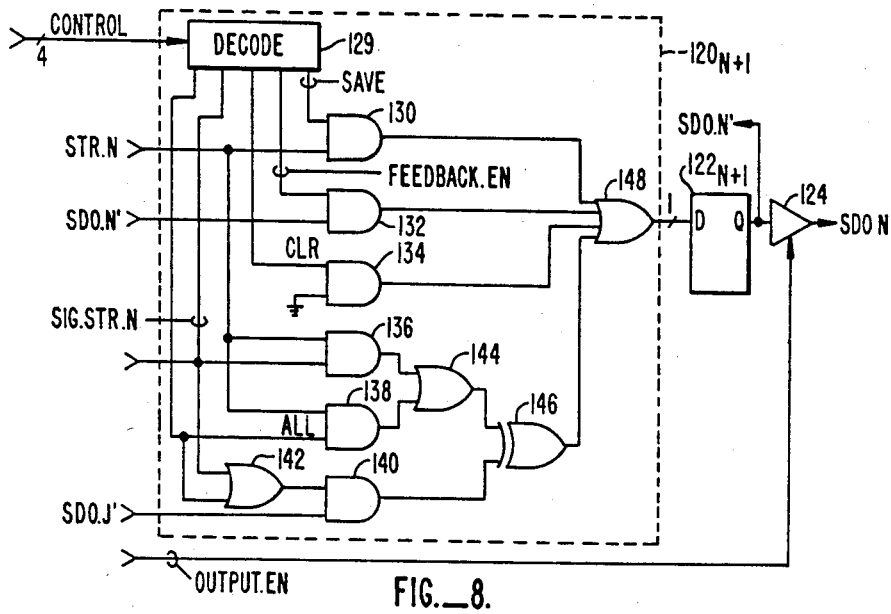
FIG._8.

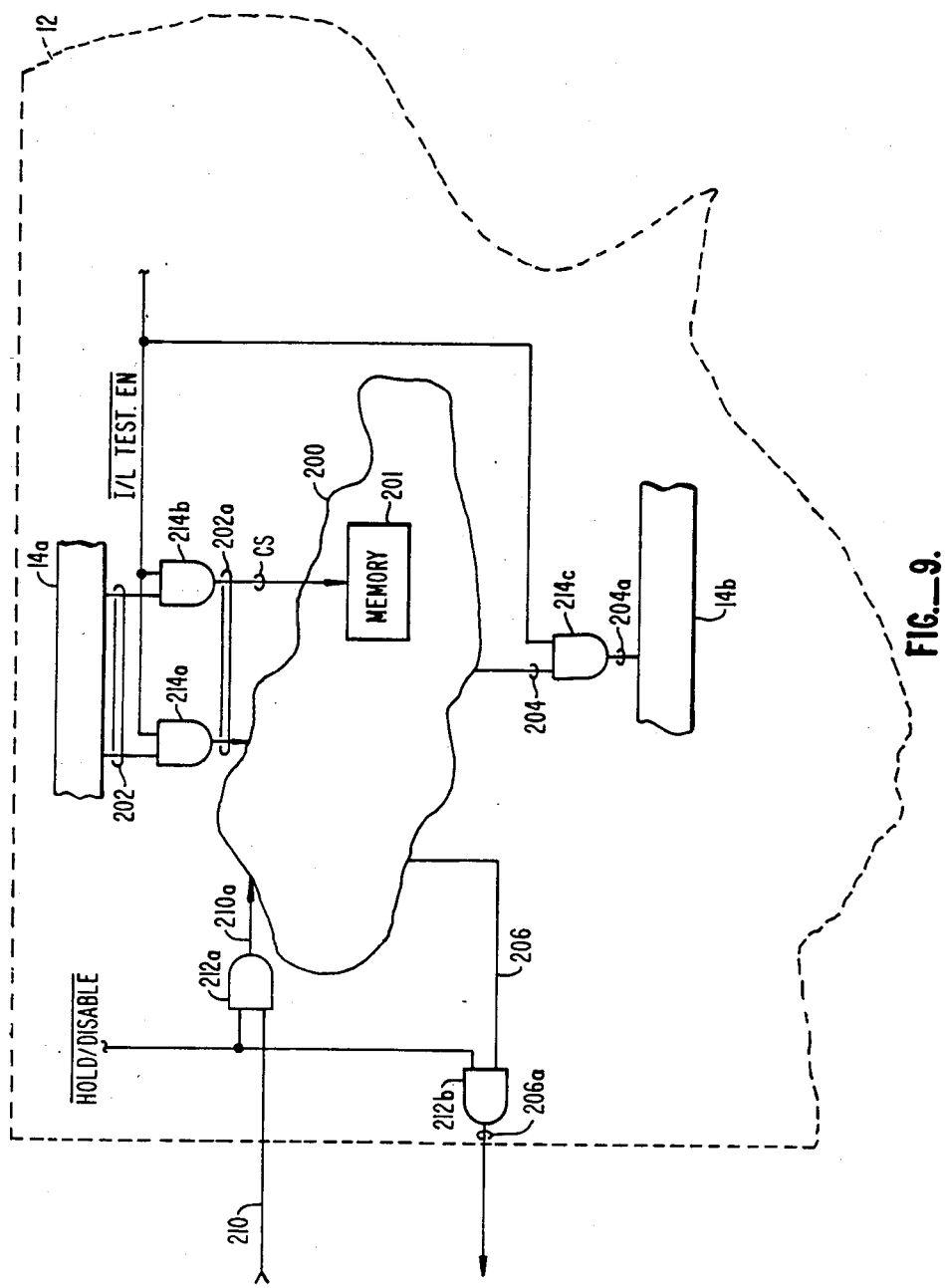
FIG._9.

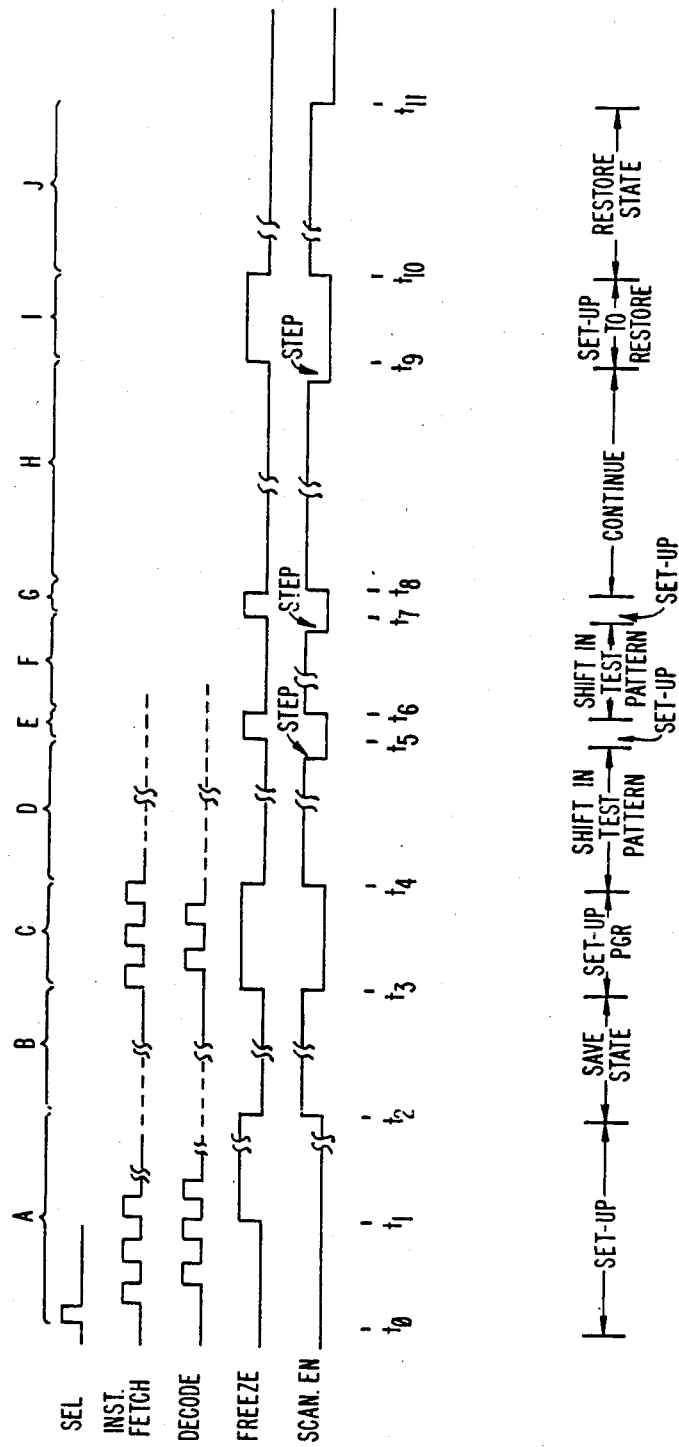
FIG._10.

IN-LINE SCAN CONTROL APPARATUS FOR DATA PROCESSOR TESTING

BACKGROUND OF THE INVENTION

The present invention is directed to testing digital logic such as is found in data processing systems and apparatus. More specifically, the invention relates to a scan control apparatus that produces sequences of test patterns that are shifted ("scanned") into and out of the digital logic, producing result signatures from which can be determined whether or not the digital logic will function without fault.

Digital or logic systems have often been tested by applying a variety of test signals to the system and monitoring the output signals produced in response. Adding to this technique, logic systems have also been designed to incorporate elemental memory stages (i.e., flipflops) that can be selected to function in one of two modes: A first mode in which they operate normally within the system as flipflops, registers, and other elemental memory stages, and a second mode in which a number of the memory stages are connected in series to form an extended shift register or, as more commonly referred to a, "scan line." Bit patterns are then scanned into and out of the scan lines, the output being analyzed (usually by comparing them to known or standard patterns), to determine the operability of the stages and interconnections of the tested logic.

Often microprocessors were used to control the testing, including forming the bit patterns that are scanned into the scan lines and retrieving and storing the results produced by the scanning. Usually, such testing will produce large amounts of output data, requiring large amounts of storage area to keep the test information passed through the scan lines for later analysis. For this reason, only a limited number of bit patterns are used to limit the amount of memory used for storing test information, thereby limiting the testing that could be done.

Additionally, presently known test techniques of this type were not capable of in-line testing (i.e., executing a test during operation of the system without terminating that operation). Usually, the system was halted before testing could be conducted, and then restarted after testing was completed.

Further, prior methods of scan testing were performed in a manner that allowed a relatively significant time (in terms of processor time) to elapse between the installation of the bit pattern and any operational steps that passed that bit pattern through one or more circuit stages of the system. Accordingly, tests of this type were often unable to catch those most difficult of all problems to trace: Timing or race problems within the processor system.

Accordingly, it can be seen that apparatus is needed capable of exercising a digital system, such as a processor or other logic, as completely as possible. The apparatus should be able to perform its test upon the system in a manner that is quick and transparent, disturbing the system operation as little as possible, and should also operate in a manner that will detect such "run time" errors as race and timing problems.

SUMMARY OF THE INVENTION

The present invention provides scan control apparatus capable of testing, in place, a digital system in a manner that provides inherent high coverage of the elements of the system. Tests can be conducted "in line;" that is, the present invention can conduct a test operation with only a brief but unobtrusive interruption of run-time operation of the system. The apparatus is capable of executing the tests at high speed, with high efficiency, and in a manner that makes the test essentially transparent to the system tested.

According to the present invention, certain of the elemental storage units, or flipflops, that make up the digital system to which the invention is attached are designed to be switchable in response to assertion of a scan signal between two modes of operation: A normal mode, and a test mode. When the scan signal is not asserted, the storage units form flipflops, counters, latches, and the like, depending upon how they were used in the design of the system. When the scan signal is asserted, however, certain of the storage units are logically reconnected to one another to form a number of large or extended shift registers or "scan lines." Each scan line so configured by the scan signal has an input terminal for receiving a test pattern, and an output terminal for providing the test pattern thereat after it has been passed through the scan line. Scan control apparatus is provided for generating control signals, including the scan signal and a pseudo-random bit pattern, that are applied to the now-formed scan lines of the system during testing. Before actual testing, however, the scan control apparatus uses the scan lines to access (shift out) and save the state of the system. After testing, the saved state can be replaced to allow the system to proceed as if never interrupted. A cyclic redundancy encoding for compression is used to optionally compress the bit patterns shifted through the scan lines so that, for example, with an extremely large number of the resultant test patterns (for example, 40 million bytes, using 40 scan lines, each 128 bits maximum in length), a 5-byte signature is obtained to determine a PASS/FAIL for the test.

The scan control apparatus is a microprogrammable state sequencer, operable in response to sequences of instructions, and is itself operated in response to a diagnostic data test unit (DDT) that can download to the scan control apparatus the necessary instructions and data for controlling and monitoring tests conducted.

BRIEF DESCRIPTION OF THE DRAWINGS

FIG. 1 is a block diagram, illustrating in diagrammatic form the major elements of the invention in combination with the associated logic system with which the invention is used;

FIG. 2 is a block diagram showing the details of the scan control unit of FIG. 1;

FIG. 3 is an illustration of the elemental storage units, or flipflops, that form a part of the associated system tested by the present invention, illustrating their reconfiguration, in response to a SCAN.EN signal, to form extended, serial shift registers or scan lines for receiving bit patterns during testing;

FIG. 4 is a truth table, showing the control signals that are applied to, and their effect upon, the storage units of FIG. 3;

FIG. 5 is a block diagram of the hold enable registers that form a part of the scan control apparatus of FIG. 1, and operate in response to the scan control unit, to provide scan control signals for controlling the scan lines of FIG. 3;

FIG. 6 is a logic diagram of one stage of the freeze/-pause (F/P) units of FIG. 5, illustrating its function of producing the group control signals;

FIG. 7 is an illustration of one of the cyclic redundancy compression (CRC) circuits of FIG. 1;

FIG. 8 is a logic diagram of one stage of the CRC logic of FIG. 7;

FIG. 9 is an illustration of isolation of a portion of a "logic island" of the system under test, during testing; and FIG. 10 is a timing diagram used to illustrate certain operational aspects of the invention.

DETAILED DESCRIPTION OF THE INVENTION

Referring to the Figures, and for the moment FIG. 1, designated generally with the reference numeral 10 is the scan control apparatus of the present invention, structured to perfom in-line, in place, tests on a digital logic assembly 12 which could be, for example, a data processor or the like. Included in the logic assembly 12 are a number of individual, elemental state storage units (e.g., flipflops—FIG. 3) capable of being configured in one of two operational modes depending upon assertion or non-assertion of certain control signals (further defined hereinafter) applied to the state storage units: Non-assertion of the control signals establishes a first mode in which the state storage units function within the digital logic assembly 12 in normal fashion (i.e., as designed for the logic assembly). Assertion of the control signals, however, will reconfigure the interconnections of the state storage units into a plurality of extended shift registers or "scan lines" 14. For the purposes of the description of the present invention, the scan lines 14 are grouped eight to a group, each group designated with the reference numeral 16. There are five of such groups 16 of scan lines 14, group ∅ (GRP-∅) through group 4 (GRP-4).

Each scan line 14 is 128 bit positions maximum. Some scan lines 14 are less than 128 bit positions in length, but none are more, although the invention, as presently structured, can handle scan lines up to 256 bit positions in length. Scan lines longer than 256 bit positions will require a larger cycle counter 52 (FIG. 2), which is used to count the number of clocks used to scan in a test pattern for the full length of a scan line.

The scan control apparatus 10 also includes a scan control unit (SCU) 20 that is operable in response to instructions and data stored in a random access memory (RAM) 22. Interconnecting the RAM 22 and the SCU 20 is a 13-bit-wide address bus 24 and a 9-bit-wide (eight bits of data, one bit even parity) RAM data bus 26.

The SCU 20 functions in response to the instructions and data stored in the RAM 22 to produce predetermined and/or pseudo-random bit patterns that are communicated to the groups 16 of scan lines 14 on a 16-bit Scan Data In (SDI) bus, and receives the results of the testing on an 8-bit Scan Data Out (SDO) bus. Hold control signals that function to condition the scan lines 14 are provided the digital logic assembly 12 from a 40-bit HOLD bus that emanates from a number of hold enable registers 30. The hold control signals generated by the SCU 20 are conducted to the hold enable registers 30 on a HLD.CTL bus and, when asserted, function to selectively condition the context of the individual hold enable registers to produce signals that control operation of the scan lines 14 in a manner discussed further below.

The results of any testing are optionally compressed by a group of cyclic redundancy compression (CRC) units 34 (CRC-∅-CRC-4) that receive CONTROL and ENABLE signals on a 9-bit CRC CONTROL bus to direct their operation. The outputs of the CRC groups 34, which are tri-stated, form the SDO bus. The compression technique used is a simple variant of cyclic redundancy encoding.

The SCU 20 operates under initial control of a diagnostic data transceiver (DDT) 36, which is a microprocessor-based unit that functions to download instructions and data to the RAM 22 of the SCU 20, and is capable of presetting the state of any or all of the registers of the SCU 20 through the downloaded instructions.

The SCU 20 is illustrated in greater detail in FIG. 2. As shown, the backbone of the SCU 20 is an internal data bus (IDB) 40 which interconnects all the operational units of the SCU 20. Instructions or commands are brought into the SCU 20 on the bidirectional RAM data bus 26 through a multiplexer (MPX) 42 to the IDB 40, loaded in a command (CMD) register 44, and from there applied to control logic 46. Each command includes four bits of operation code, which are by control logic 46 which decodes the current command and generates the internal necessary timing and control signals for the various units of the SCU 20. The other four bits are used to form (with the operation code) the 9 bits of CRC control signals that are communicated from the control logic 46 to the CRC group 34 (FIG. 1).

The control logic 46 also receives zero detect signals from zero decode logic 48 and 50. Each of the zero decode logic 48, 50, respectively receive counts produced by a cycle counter 52 and a loop counter 51. Each zero decode logic 48, 51 functions to produce a signal indicative of a count equal ZERO from its associated counter. As FIG. 2 illustrates, the cycle counter 52 and loop counter 51 are loaded from the IDB 40.

The cycle counter 52 is preset with a count (through an instruction-controlled RAM access) indicative of a number of desired iterations of an event for a single instruction, and, is sequentially decremented by a signal (not shown) produced by the control logic 46 until a count of ZERO is reached. The cycle counter 52 functions to count, for example, the number of bits of test patterns shifted into the scan lines 14. The loop counter 51 is similar, except that it is loaded with a count indicative of a number of iterations a group of instructions is to be executed by the SCU 20, counting each iteration through the group.

Data incoming from the RAM 22 (FIG. 1) on the RAM data bus 26 is accessed by 13-bit addresses produced either by a command address register 60 or a data address register 62, each of which is multiplexed onto the RAM address bus 24 by a multiplexer MPX 64.

A status register 45 contains information concerning whether the SCU 20 is in an idle state (not operating state) or a busy state (executing instructions out of its RAM 22). When in the latter state, the DDT 36 has only limited access to the SCU 20: It can read the status register 45, or it can halt operation by writing to the control logic via the ADDR bus.

The output of the status register 45 is coupled to the DDT data bus 24 via a multiplexer (MPX) 43, which also couples the RAM data bus 26 thereto. An IDLE signal is produced by the status register 45 and used to control MPX 42. When the SCU 20 is in its idle state, IDLE is asserted and MPX 42 communicates the DDT data bus 24 to the IDB 40. When the SCU 20 is in a busy state, IDLE is deasserted, and the RAM data bus 26 is communicated to the IDB 40 by the MPX 42.

Organization of the RAM 22 is such that the lower 512 bytes of memory locations (i.e., addresses ∅ through 511) contain the commands or instructions stored in the SCU 20. Each instruction is two bytes: A first byte contains the operation code, and is followed by a second byte containing data. Each operation code portion of the instruction is stored at the even addresses (of memory locations ∅-511), and each data portion of the instruction is stored at the odd addresses. Accordingly, the least significant bit (LSB) of the command address register 60 is a flipflop that merely toggles in response to a T signal produced by the control logic 46. In addition, since only eight bits (including to the toggled bit location of the command address register 60 nine bits in all) are needed, the command address register itself is only eight bits wide, the multiplexer (MPX) 64 pads the four most significant bit positions with zeros to form the necessary 13-bit address.

The SCU 20 further includes a 16-bit pattern generator/register (PGR) 70 that produces the bit patterns used for testing the logic unit 12 (FIG. 1). The PGR 70 is conventionally designed to function either as a 16-bit register or a 16-bit polynomial counter capable of producing $2^{16}-1$ bit pseudo-random combinations from any seed value except ZERO. If seeded (loaded) with a ZERO value, and operated in its polynomial counter configuration, the PGR 70 will remain in the ZERO state until seeded with another non-ZERO value. Seeds are provided via the IDB 40 through a multiplexer 72. The output of the PGR is applied to the SDI bus for communicating the content of the PGR 70 to the scan lines 14 of the digital logic assembly 12.

The PGR content can also be made available to the RAM 22 via the RAM data bus 26 through a multiplexer (MPX) 74. Although not specifically shown, the 16-bit output of the PGR 70 is multiplexed in eight-bit groups by the MPX 74, and in addition has parity added to each eight-bit portion when stored in the RAM 22.

The RAM 22 can also receive data from the SDO bus, the DDT data bus 24, and the data address register 62 via the MPX 74. Regarding the 13-bit output of the data address register 62, the 13 bits are multiplexed by the MPX 74, providing a first 9-bit word that includes an eight-bit portion of the data address register 62 content, and a second nine-bit word that includes the remaining five-bit portion of the data address register 62 content.

Finally, the SCU 20 includes a pair of test registers 76 and 78 that are each loadable, in response to timing and control signals from the control logic 46, from the IDB 40. The content of the test registers 76 and 78 are communicated to the hold enable registers 30 (FIG. 1) by the HLD.CTL bus. The signals produced by the test registers 76 and 78 function to qualify the outputs of the hold enable registers 30 (which are loaded by data communicated on the SDI bus), producing the HOLD signals that control the scan lines 14.

As indicated in the discussion with respect to FIG. 1, the control exhibited by the apparatus of the present invention operates, in part, to produce control signals to configure predetermined ones of the flipflops contained within the logic unit 12 being tested to form a number of extended shift registers for scan lines 14. Illustrated in FIG. 3 is this concept. FIG. 3 shows one of the scan lines 14 formed from elemental storage units (e.g., flip-flops) $80_1, 80_2, \ldots 80_N$. Each of the storage units $80_1 \ldots 80_N$ receives at a clock (CLK) input a CLOCK signal, a periodic signal produced by the system. Received at a data (D) input would be a data signal produced by other circuitry of the digital logic assembly 12 during normal operation. Each of the storage units $80_1 \ldots 80_N$ includes a scan data (SD) input, the storage unit $80_1$ receiving one line of the SDI bus at its SD input. The other storage units $80_2 \ldots 80_N$ receive at their respective SD inputs the output (Q) of the immediately preceding stage of the scan line 14.

Logic circuitry, comprising an inverter 82 and a two-input AND gate 84 produce two signals that are respectively received by the data enable (DE) and scan enable (SE) inputs of each of the storage elements $80_1, \ldots 80_N$ to control the operation of the scan line 14 during test operation, or to release the individual storage elements $80_1, \ldots 80_N$ from the scan line 14 configuration to allow them to be used normally.

Two signals are received to control configuration and operation of the scan line 14: A HOLD ENABLE (HOLD.EN) and a SCAN ENABLE (SCAN.EN) signal. Shown in FIG. 4 is the truth table for the individual storage elements $80_1, \ldots 80_N$ of the scan line 14. Thus, for example, when both the HOLD.EN and SCAN.EN are a logic ZERO (causing a logic HIGH to be applied to the DE inputs of each storage unit $80_1 \ldots 80_N$), each elemental storage unit operates in its normal mode so that when clocked by the CLK signal, the Q outputs become whatever is applied to the D output. When a logic LOW is applied to the DE inputs (i.e., the HOLD.EN is a logic HIGH), each storage unit holds its state. If desired, additional circuitry can be added so that the DE input receives signals from other elements of the logic unit 12 (FIG. 1), in addition to the output of the inverter 82, operating to enable receipt of data of the storage element. However, such additional circuitry must be constructed so that the HOLD.EN signal overrides everything to immediately de-assert anything then applied to the DE input.

Continuing with the review of FIG. 4, if the SCAN.EN becomes a logic ONE, with the HOLD.EN at logic ZERO, the storage units $80_1 \ldots 80_N$ will now be enabled to receive the data applied to their respective SD inputs, i.e., they are now configured as a scan line 14. When the HOLD.EN signal is asserted (a logic ONE), the content of the scan line 14 is frozen, such that no state change is allowed.

An additional property of the storage units $80_1 \ldots 80_N$ is that their design is such that the SE input will override the DE input. That is, if a logic HIGH is applied to the SE input, the Q output will assume whatever is applied to the SD input (with every CLOCK pulse)—whatever is applied to the DE input. If the DE input has a logic HIGH asserted thereat, when a logic LOW is applied to the SE input, the Q output will assume whatever is applied to the D input with each CLOCK. Finally, if a logic LOW is applied to both the SE and DE inputs, the storage element will remain unchanged.

The HOLD.EN signal is produced, for each individual scan line 14, by the HOLD ENABLE registers 30. The HOLD ENABLE registers 30 are shown in greater detail in FIG. 5. As illustrated, the HOLD ENABLE registers 30 include five separate eight-bit registers 90-94, each corresponding to one of the scan groups 16. Each bit position of each of the HOLD ENABLE registers 90-94 corresponds to one of the scan lines 14. The output of the HOLD ENABLE registers 90-94 are applied to freeze/pause (F/P) circuits 95-99. Data is loaded in each of the hold enable registers 90-94 from eight bits of the SDI bus in response to load enable signals produced by an address decode circuit 100. Three other bit lines of the SDI are applied to the address decode circuit 100 to generate the load enable signals. The HOLD ENABLE registers 90-94 are capable of being selectively loaded, or all simultaneously loaded with the same eight-bit control word. Loading is effected by the load enable (LD.EN) signal from the control logic 46 of the SCU 20.

The F/P circuits 95-99 also receive the signals FREEZE, PAUSE, FREEZE.EN and PAUSE.EN from the test registers 76 and 78 of the SCU 20 (FIG. 2) to condition each of the outputs from the registers 90-94, producing the group control signals for each of the scan lines, i.e., to produce the HOLD.EN signal for each scan line. This latter conditioning is illustrated by the logic diagram of FIG. 6.

The F/P circuits 95-99 include a conditioning stage for each of the bit positions of the corresponding hold enable registers 90-94. For example, as FIG. 6 illustrates, the F/P circit 95 includes conditioning logic 104 that receives the bit position of the hold enable register 90 corresponding to one of the scan lines 14 (scan line 1, for example) of the group zero (GRP-∅) of the groups 16. Setting this bit (of the HOLD ENABLE register 90) to a ONE will select the associated scan line 14 to be held by assertion of the PAUSE signal. The PAUSE, FREEZE, FREEZE.EN and PAUSE.EN signals function to condition or override the command of the bit position to produce the HOLD.EN signal for scan line 1 (S/L-1).

Thus, each stage of the hold enable register 90 has a corresponding conditioning logic 104 in the F/P circuit 95, and the same is true with respect to the hold enable registers 91-94 and their corresponding F/P circuits 96-99. As FIG. 6 illustrates, therefore, the conditioning logic 104 includes three two-input AND gates 106, 108 and 110, the outputs of which are coupled to a four-input OR gate 112. The AND gate 106 receives at one input the state of the content of the stage of hold enable register 90 corresponding to S/L-1. The other input (an active HIGH) of the AND gate 106 receives the PAUSE signal from the test register 76 of the SCU 20 (FIG. 2).

The AND gate 108 receives the FREEZE.EN signal from test register 78 of the SCU 20, while at its other input the AND gate 108 is adapted to allow other signals to freeze the storage elements $80_1, \ldots 80_N$ that make up the scan line S/L-1. These other freeze signals might be generated by the digital logic assembly 12 upon recognition of an error, or other designed condition.

In similar fashion, the AND gate 110 is configured to receive the PAUSE.EN signal from test register 78 while at its other input the AND gate 108 receives other pause signals for pausing the storage elements $80_1 \ldots 80_N$. These pause signals might be generated by the digital logic assembly 12 to temporarily hold off state changes upon detection of a designed condition. Finally, the FREEZE signal from the test register 76 is applied directly to the OR gate 112 and logically ORed with the outputs of the AND gates 106-110, resulting in the HOLD.EN signal for the scan line S/L-1). Disregarding for the moment the OTHER FREEZE and OTHER PAUSE signals, it can be seen that regardless of the content of the register stage corresponding to the scan line S/L-1, the FREEZE signal will override to produce the HOLD.EN signal, causing the associated scan line to be selectively held or frozen. It can be seen, therefore, that the purpose of the hold enable registers 30, when FIGS. 1, 5 and 6 are taken together, are to selectively hold (or freeze) one or more of the scan line 14 during a test operation. When a scan line 14 is forced into a hold or frozen mode, the state of the scan line 14 is not allowed to change. The capability of selectively freezing a scan line 14 allows the SCU 20 to select which scan lines 14 are to be shifted, frozen, or put into a run mode of operation during testing. This allows the SCU 20 to configure a test on any number of any of the scan lines 14, from ∅ to all (40) at a time.

It may be advantageous at this time to more particularly define the PAUSE, FREEZE, FREEZE.EN and PAUSE.EN signals:

PAUSE: This signal is asserted by the SCU to selectively freeze those scan lines 14 enabled by the corresponding bit positions of the hold enable registers 90-94. This signal is used by the SCU 20 to selectively freeze certain of the scan lines 14, while those scan lines 14 that are not frozen can be put into a run mode (to allow free running execution for a controlled number of cycles, from 1 to a number approaching infinity) or a scan mode (to allow data to be shifted one bit per clock).

FREEZE: When asserted, this signal asserts the HOLD.EN signal applied to all scan lines 14 to be asserted, forcing the digital logic assembly 12 to freeze, disallowing any state changes.

FREEZE.EN: The SCU 20 asserts FREEZE.EN to enable the OTHER FREEZE signals to allow a freeze of the digital logic assembly 12. When not asserted, these signal are not able to cause a freeze of the digital logic assembly 12.

PAUSE.EN: In a fashion similar to FREEZE.EN, the PAUSE.EN from the SCU 20 enables OTHER PAUSE SIGNALS generaed by the digital logic assembly 12 to cause a temporary freeze of those scan lines 14 selected by a ONE in the bit position of the hold enable register $80_1 \ldots 80_N$ corresponding to that scan line.

Before continuing, it may be advantageous at this point to discuss the use of the FREEZE signal in controlling operation of the scan lines 14 with reference to FIG. 10. FIG. 10 is a simplified timing diagram, showing in summary form operation of the scan apparatus 10 through the signals it provides.

Initially, the SCU 20 will be in its idle state, and the status register 45 (FIG. 2) will assert (at times $t_\emptyset$ and before) the IDLE signal to cause the DDT data bus 24 to be communicated to the IDB 40 via the MPX 42. The SCU 20 is "awakened" by the DDT 36 (FIG. 1) asserting momentarily the SEL signal. This causes the control logic to begin issuing timing and control signals to access and decode instructions from the RAM 22. Thus, during the time period designated "A" in FIG. 10 (from time $t_\emptyset$ to time $t_2$), the SCU 20 will initialize itself in response to the SEL signal, including loading test register 76 with a word that produces assertion of the FREEZE signal at time $t_1$ and causing HOLD.EN to be asserted globally to all scan lines 14 (see FIGS. 5 and 6). As indicated above, FREEZE is a global signal; it is applied to all F/P circuits 95-99, causing the eight HOLD.EN signals from each of the F/P circuits 95-99 to also be asserted. This will de-assert the signal applied to the DE input of the state storage elements $80_1$-$80_N$ (FIG. 3) of each of the scan lines 14, freezing the logic assembly 12. The word loaded in test register 76, and test register 78, will assert the PAUSE, HOLD/DISABLE, and I/L TEST.EN signals to isolate or "fence" the digital logic assembly 12 and selected portions thereof from outside effects, or affecting external apparatus, during state changes experienced during testing. This is discussed further below.

The SCU 20 continues setting-up, preparing (in this discussion) to save the state of the logic assembly 12, and seeding the PGR 70 (FIG. 2) with a ZERO. When, at time $t_2$, the set-up is complete, the SCU 20 will load the test register 76 to de-assert FREEZE (causing de-assertion of HOLD.EN), and at the same time assert SCAN.EN. The effect is to configure the storage units $80_1$–$80_N$ as scan lines 14, responding to CLOCK (FIG. 3) to shift the state of the scan lines 14 out of the digital logic assembly 12 and onto the SDO bus (FIG. 1) so that the state of logic assembly 12 can be saved in RAM 22. The SCU 20 will control the PAUSE signal, together with periodic loads of selected ones of the hold enable registers 90–94 (FIG. 5), to selectively freeze four of the scan line groups GRP-∅–GRP-4, allowing one group to operate, and selecting the corresponding CRC group to conduct the selected scan lines 14 to the SDO bus (see below). In this way the 40 scan lines are multiplexed onto the 8-bit (line) SDO bus, during the "save" operation.

While the state of the digital logic assembly 12 has been saved (during the $t_2$ to $t_3$ time period labeled B in FIG. 10) all ZEROs have been scanned into the scan lines 14, and sequential generation and sensing of pseudo-random test patterns into the scan lines 14 can commence. Thus, during the period labelled C, the logic system 12 is frozen (i.e., FREEZE asserted, SCAN.EN de-asserted) and the SCU 20 sets up for testing, including seeding the PGR 70 with a number other than ZERO. At time $t_4$, set-up is complete, FREEZE de-asserted (releasing all scan lines 14), and SCAN.EN asserted for 128 CLOCK cycles (counted by the cycle counter 52 of the SCU 20). When the signal from the zero decode circuit 48 is asserted, the SCU 20 will force SCAN.EN to be dropped for one CLOCK cycle, and, at the end of this cycle, at time $t_5$, assert FREEZE. This scans into each of the scan lines 14, in parallel, the pseudo-random patterns generated by the PGR 70. Once loaded, the scan lines 14 are, in effect, momentarily dismantled, and the digital logic assembly 12 is allowed to normally operate for one cycle (i.e., it is "stepped" once; it could be allowed to step a number of cycles, if desired).

During the period labelled E, the SCU 20 prepares to generate another test pattern—holding the SCU 20 frozen. At time $t_6$ another scan is commenced, while the result of the previous scan/step operation is shifted into the CRC groups 34 to generate a test signature. One cycle before the period labelled F is completed, another step is performed, followed at time $t_7$ by assertion of FREEZE, and another set-up period (G). This scan/-step operation continues, generating a test result signature that is maintained in the CRC group 34, until every bit position of each of the scan lines 14 have seen the entire $2^{16}-1$ bit patterns generated by the PGR 70.

This testing operation is followed by a save of the five bytes of test result signature to the RAM 22 (via the SDO bus and MPX 74), and a restoration of the state of the digital logic assembly 12 (saved during the period B, described above) in much the same manner as it was saved, only in reverse.

The bit patterns that are shifted into the scan lines 14 are compressed by the CRC units 34 (i.e., CRC-∅ ... CRC-4). Illustrated in FIG. 7 is one of the CRC units 34, CRC-∅. CRC-1, CRC-2, CRC-3 and CRC-4 are identical in structure, function and operation to CRC-∅, so that the following discussion will apply equally to them.

As FIG. 7 illustrates, for each of the eight scan line outputs (STR.∅ ... STR.7) from GRP-∅ of scan lines there is a CRC logic unit $120_1$–$120_8$ to receive that output (FIG. 7). Each CRC logic unit $120_1$–$120_8$ generates a CRC signal that is coupled to the data (D) input of a flipflop $122_1$–$122_8$. The output (Q) of each of the flipflops $122_1$–$122_8$ are coupled to the corresponding bit lines SDO.∅–SDO.7 of the SDO bus through tri-state amplifiers 124. The CRC control signals from the control logic 46 of the SCU 20 (FIG. 2) are received by CRC-∅, and certain of them function to enable the tri-state amplifiers 124, while others are applied to the individual CRC logic units $120_1$–$120_8$.

Turning now to FIG. 8, one of the CRC logic units, CRC logic unit $120_1$, is illustrated in greater detail. As illustrated, the CRC logic unit $120_1$ includes six two-input AND gates 130, 132, 134, 136, 138 and 140, two two-input OR gates 142 and 144, an EXCLUSIVE-OR gate 146, and a four-input OR gate 148 that produces the signal that is applied to the data (D) of the input flipflop $122_1$.

As FIG. 8 shows, the CRC control signals are received by decode logic 129 of the CRC-∅, and are decoded to produce a SAVE signal, a feedback enable (FEEDBACK.EN) signal, a clear (CLR) signal, a signal which selects only a single scan line 14 for CRC encoding, in this case scan line N (SIG.STRIN), and a signal that selects all 8 scan lines 14 for CRC encoding, the (ALL) signal. The SAVE signal functions to condition AND gate 130 to enable the output of the scan line 14 associated with the CRC logic unit $120_{N+1}$, i.e., STR.N to be applied to the data (D) input of the flipflop $122_{N+1}$. The FEEDBACK.EN signal functions to condition AND gate 132 to enable the SDO.N' signal (the Q output from flipflop $122_{N+1}$) to be applied to the data (D) input of the flipflop $122_{N+1}$, essentially preserving the state of the flipflop. The CLR signal conditions the AND gate 134, whose second input is grounded, to apply a logic ZERO to the D input of the flipflop $122_{N+1}$ to set it to a ZERO. The SIG.STR.N signal functions to logically EXCLUSIVE-OR the output of the associated scan line 14, STR.N, and an appropriate feedback term from the CRC output SDO.J', to compress through a variant of cyclic redundancy encoding the signal applied from STR.N. The relationship of STR.N and SDO.J' is such that for each N the appropriate J is:

| N | J |
|---|---|
| 1 | 0 |
| 2 | 1 |
| 3 | 2 |
| 4 | 3 |
| 5 | 4 |
| 6 | 5 |
| 7 | 6 | and for SDO.∅ (i.e., N=0), the feedback term is derived by inversion of SDO.7' from flipflop $122_8$ (FIG. 7). The resultant EXCLUSIVE-OR produced by EXCLUSIVE-OR gate 146 is then applied to the data input (D)

of the flipflop $122_{N+1}$ (via OR gate 148) for storage. The ALL signal functions to perform a similar EXCLUSIVE-OR function, except that the ALL is global; that is, it is asserted in all CRC logic units $120_1$–$120_8$ of the entire CRC group 34, whereas the SIG.STR.N is applied only to that CRC logic unit corresponding to STR.N—in each CRC group 34. The SIG.STR.N is applied for selective encoding of only 1 of the 8 STR.N outputs of the associated scan line 14, while the ALL signal functions to globally compress all 8 STR.N outputs of the associated scan line 14 group 16.

Interconnecting various of the elemental memory units forming the scan lines 14 are groups or "islands" of logic circuitry. These islands are typically stateless, allowing for only combinatorial interconnection between the outputs of a number of elemental state storage units forming a part of a scan line 14 and the inputs of another number of (identical or different) state storage units forming another (identical or different) scan line 14. These combinatorial logic islands are well-formed and are well tested during the test operations.

It is possible, however, that certain of these logic islands may include some form of memory which can or will retain state information necessary for the proper operation of the digital logic assembly 12. But, such memory does not form a part of any scan line 14 during tests. These logic islands (i.e., those with some form of memory) present three problems: First, when the operation of the digital logic assembly 12 is interrupted, and its state is to be saved, preservation of the state maintained by the memory-containing logic islands is necessary. Second, during testing, care must be taken to ensure that signals produced outside the memory-containing logic island do not alter or affect its state. Third, again during test, the state information within these islands may affect the island output signal values feeding the scan lines 14. This is undesirable during an in-line test, since these values reflect a machine state at the time of test, and, therefore, uncontrolled by the test itself.

Accordingly, during testing, these memory-containing logic islands are "fenced" in a manner that inhibits input signals to the island, and ensures that signals generated by the circuitry in the island do not affect other circuitry in the digital logic assembly 12, specifically, scan lines 14. To reiterate, fencing is necessary for two reasons: To negate the effect of state changes in the scan lines 14, during testing, on the circuit elements, and particularly the state (i.e., memory) of these memory-containing logic islands, and to inhibit the effect of the unknown or indeterminate state of the memory-containing logic island upon the scan lines 14.

Fencing is used also on a larger scale: Some subset of all the logic islands may receive signals generated external to the digital logic assembly 12, and may also themselves generate output signals that are delivered external to the digital logic assembly 12. An example of an external input to the logic assembly 12 is an input channel, or a sensor input, to the logic assembly 12. An example of an external output is an output channel, or a control signal to a peripheral unit (not shown). During testing, it is necessary to fence the externally generated signals, since these signals, when applied to the logic assembly 12, may change in apparently random ways, affecting the test results. It is also necessary to fence the logic assembly 12 from the peripheral unit in such a way as to not affect the peripheral unit, since during testing the digital logic assembly 12 would otherwise present random sequences of random values to the peripheral unit which could be erroneously interpreted by the peripheral unit and affect its operations. Thus, during testing of the logic unit 12, input and output interfaces are forced to known states or inhibited in order to isolate the logic assembly 12 from external, unknown perturbations, and to similarly ensure that state changes caused by the testing do not, in turn, after external units attached to the logic assembly 12.

Two signals, $\overline{\text{HOLD/DISABLE}}$ and $\overline{\text{I/L TEST.EN}}$, are used for such fencing. These signals are driven from test registers 76 and 78. The $\overline{\text{HOLD/DISABLE}}$ signal is used for fencing the external inputs to the digital logic assembly 12, and to inhibit or fence the signal lines from the logic assembly 12. The signal $\overline{\text{I/L TEST.EN}}$ is used for fencing the internal memory-containing logic islands of the logic assembly whose memory units are not and cannot be controlled to form scan lines 14 during test.

This concept is diagrammatically illustrated in FIG. 9, wherein a logic island is represented, designated with the reference numeral 200. As FIG. 9 shows, the logic island 200 contains a memory 201, and receives signals 202/202a from certain of the elemental storage units that make up, during test mode, the scan line portion 14a. At least some of these signals (for example, "CS") operate the memory 201. Similarly, signals produced by the logic island 200 may be coupled, by signal lines 204/204a, to a stage of another scan line portion 14b. Additional signals, such as indicated by signal lines 210/210a, may be received from a source (not shown) external to the logic assembly 12 of which the logic island 200 is a part.

When testing is commenced, the AND gates, 212a and 212b, operate in response to assertion of the $\overline{\text{HOLD/DISABLE}}$ signal to fence the logic island 200 (and similar logic islands) from the external "world" (i.e., external to the logic assembly 12). In similar fashion, the AND gates 214a, 214b, and 214c respond to assertion of the $\overline{\text{I/L TEST.EN}}$ signal to fence the logic island 200, and in particular the memory 201, from being affected by states of scan line portion 14a, or from affecting the state changes of scan line portion 14b.

Referring once again to FIG. 1, the scan lines that are formed during test mode within the digital logic assembly 12 can be any length up to 128 bit positions. Each of the groupings of scan lines GRP-∅ through GRP-4 receive eight lines of the SDI, each of the scan lines 14 within each group receiving one SDI bus line. Three of the scan line groups 16 receive the eight high-order bit positions of the SDI bus, while the remaining two receive the eight low-order bit positions.

In operation, the SCU 20 is initially provided with the necessary programming and data by the DDT 36 by initializing the RAM 22 of the SCU 20. Since the SCU is in an idle condition, the IDLE signal from the status register is asserted, selecting the DDT data bus 24 for communication to the IDB 40 via the MPX 42 (FIG. 2). This gives access to the DDT 36 to the data address register 62 of the SCU 20 and, thereby, to the RAM 22. The low-order 512 bytes of memory locations of the RAM 22 are loaded by the DDT 36 with instruction sequences. The remaining memory locations of the RAM 22 are loaded with data. At any time thereafter, either by some external source or by programmed control within the digital logic assembly 12, the apparatus 10 of the present invention can be called into action to perform a high speed test in-line and in place with normal operating tasks. Briefly, as described above in connection with the discussion of FIG. 10, the SCU 20 is "awakened" to save the state of the digital logic assembly 12 to the RAM 22, execute its tests, and then reestablish the system state to allow the logic unit 12 to proceed. The two-byte instructions that operate and control the SCU 20 are listed below in Table I:

TABLE I

| OP-CODE BYTE | DATA BYTE | FUNCTION |
|---|---|---|
| 00 | ADDR | JNZD,ADR<br>If loop counter 51 is non-zero, the command address register 60 is loaded with the contents (ADDR) of the data byte (the second byte of the command). The loop counter 51 is then decremented. If the loop counter 51 is zero, the command address register 60 is incremented. |
| 10 | ADDR | JMP,ADR<br>The command address register 60 is loaded with the contents (ADDR) of the data byte. |
| 2R<br>R = reg. addr. | DATA | LDI REG, MEM<br>Load (immediate) register "R" with the data (DATA) in the second byte of the command. The designated register is addressed by the lower nibble (4 bits) in the command byte. Here, as well as other instructions herein, R refers to an address for a register or counter of the SCU 20, depending upon the value of R. |
| 3R<br>R = reg. addr. | DATA | LDI MEM, REG<br>Load the second byte of the command (DATA) with the contents of the selected register R. The register R is addressed by the lower nibble of the command's op-code byte. |
| 4R<br>R = reg. addr. | DATA | LDR REG,MEM<br>Load the register "R" with the data (DATA) addressed by the contents of the data address register 62. The register R is addressed by the lower 4 bits of the operation code portion of the instruction. |
| 5R<br>R = reg. addr. | 00 | LDR MEM,REG<br>Load the SCU 20 RAM 22 at the memory location addressed by the data address register 62 with the contents of the selected register R. The register R is specified by the lower nibble of the command byte. |
| 60<br>70 | 00<br>00 | HALT<br>The SCU 20 immediately sets the IDLE flag, and stops command execution. The SCU 20 now responds to all data transfer requests from the DDT 36. |
| 80<br>90 | COUNT | STEP, COUNT<br>This command steps or free runs the scan lines 14 the number (COUNT) of cycles indicated in the COUNT field; the second byte of the command. The cycle counter register 52 is loaded with the contents of the second byte of the command (COUNT). When the cycle counter 52 equals zero, execution ends. |
| A Fsss | COUNT | RANDOM, COUNT<br>This command is used to perform pseudo-random testing of the digital logic assembly 20, via the scan lines 14. The command causes pseudo-random data generated by the pattern generator to be scanned into the unfrozen scan lines 14. The COUNT value is loaded into the cycle counter 52, specifying the number of bits to be scanned into the scan lines 14. When the cycle counter reaches zero, the command is completed. If F (the most significant bit of the lower nibble of the command byte) is a ZERO, sss is decoded by decode logic 129 (FIG. 8) to assert SIG.STR.N, where sss=N (i.e., if sss=011, binary, N=3, decimal). If F is a ONE, then only the leftmost bit of sss is used; if s (left-most) is ZERO, the decode logic 129 asserts FEEDBACK.EN to preserve the state of register $122_{N+1}$, and if s (left-most) is a ONE, the decode logic 129 asserts the ALL signal to enable compression of all scan lines 14. |
| B Fsss | COUNT | RANDOM_STEP COUNT<br>This command is used to perform pseudo-random testing of the logic assembly 20. COUNT bits of (pseudo) random data are scanned into the scan lines 14, the scan lines released from their scan line configurations, and the logic assembly 20 stepped 1 cycle. The COUNT value is loaded into the cycle counter 52, determining the number of bits to be scanned into the scan lines 14. When the counter 52 equals ZERO, the command is completed. F and sss, of the second nibble of the command byte function the same as the RANDOM COUNT instruction, above. |
| C 0<br>D 0 | COUNT<br>COUNT | RESTORE, COUNT<br>This command is used to perform a restore (of the previously saved state) operation of the digital logic assembly 12. Alternatively, this command can be used to provide test patterns that are different from those generated by the PGR 70 of the SCU 20. The contents of memory pointed to by the data address register 62 are shifted into the unfrozen scan lines 14. Data is staged through the Pattern Generator Register 70. The data address register 62 is incremented with each shift. The COUNT value is loaded into the cycle counter 52 and determines the number of bits to be restored from memory into the scan lines 14. When COUNT equals zero, the command is completed. |
| Eg<br>Fg | COUNT | SAVE, INJECT RANDOM,COUNT<br>This command is used to perform a save operation of the state of digital logic assem- |

TABLE I-continued

| OP-CODE BYTE | DATA BYTE | FUNCTION |
|---|---|---|
| | | bly 12. The data from the unfrozen scan lines 14 is shifted into the signature CRC registers $122_1$–$122_8$. The signature CRC registers $122_1$–$122_8$ (FIG. 7) are used as pipeline staging registers for the save operation. The memory locations pointed to by the data address register 62 are loaded with the data shifted from the scan lines 14. The data address register 62 is incremented after each save. The COUNT value is loaded into the cycle counter 52 and determines the number of bits to be scanned. When the cycle counter 52 equals ZERO, the command is completed. The scan lines 14 are injected with random data depending upon the initial seed of the PGR 70. The nibble g selects which of the five CRC units 34 is enabled, causing one of the OUTPUT.EN signals to be asserted. At the same time the SAVE signal is asserted by the decode unit 129; it selects one of five CRC's. |

The high-speed execution nature of the SCU 20 allows for a near-exhaustive test of the logic unit's scannable logic structure in a time T=string length×2$^{16}$×CYCLE TIME, testing all 2$^{16}$ bit combinations for any contiguous 16-bit scan registers, using the bit patterns generated by the PGR 70. Such structure has been built and tested with a digital data processing unit using scan lines of 128 bits in length, a cycle time of 83 nanoseconds, to fully test a processor unit in less than 0.7 seconds.

Once the scan control apparatus 10 has been initialized, i.e., the RAM 22 of the SCU 20 has been loaded by the DDT 36 with the instruction sequences needed by the SCU 20, the scan control apparatus 10 is ready for operation.

If in-line testing is requested, i.e., requiring an undisturbed interruption of the operation of the digital logic assembly 12, the state of logic unit 12 must be stored. Accordingly, a first sequence of instructions to be executed by the SCU 20 will cause the test register 76 to be set to issue the FREEZE command, freezing the state of the logic unit 12. At the same time, the SCAN.EN signal is asserted to configure the individual elemental storage units $80_1$–$80_N$ (FIG. 4) in a scan line 14. Next, the PGR 70 is cleared, the PAUSE signal deasserted (deasserting the HOLD.EN signal—see FIG. 6), allowing the now configured scan lines 14 to shift their content out to the groups of CRC circuits 34. At the same time, the SAVE signal is asserted by the SCU 20 (being communicated on the CRC CONTROL bus), to prevent compression of the data from the strings. The individual outputs of the scan lines are multiplexed by the CRC units 34 onto the SDO bus, while logic ZEROs are clocked into the scan lines from the PGR 70.

The MPX 74 is operated (by control logic 46 of the SCU 20), to select the SDO bus for communication to the RAM data bus 26. At the same time, sequential addresses are generaed by the data address register 62 to cause the state information from the digital logic assembly 12 to be stored at known memory locations of the RAM 22.

Once the state of the logic unit 12 is now preserved, so that it can be reestablished later, testing may start. Typically, testing involves generating pseudo-random patterns to load scan lines, place the digital logic assembly 12 in a "RUN" state for one cycle, and then scan out the content of the scan lines through the CRC groups 34 while at the same time scanning in a new pseudo-random test pattern, to create "signatures" that can be compared to known standard signatures to determine pass/fail status of the digital logic assembly 12. The patterns scanned out of the scan lines 14 are compressed and stored in the RAM 22 in the same manner as the state information was stored, where it remains until accessed by the DDT 36 and compared to the standard signatures.

After testing is accomplished, the previously stored state information is accessed by the SCU 20 and scanned back into the scan lines of the digital logic assembly 12. Finally, the SCAN.EN signal is deasserted to allow the individual elemental storage units ($80_1$–$80_N$) of each scan line 14 to resume normal operating configuration, and the logic unit 12 is allowed to proceed.

While the foregoing discussion has provided a full and complete description of the invention, it will be evident, particularly to those skilled in this art, that various modifications and alternations can be made. For example, the present technique of producing pseudo-random test patterns that approach a weighting of 50% ONEs and 50% ZEROs. However, other weighting can also be used by storing test patterns in a memory and sequentially accessing those test patterns for application to the scan lines 14. Additionally, the PGR 70 output can be used to address a separate memory containing the test pattern. It is intended, therefore, that the instant invention be limited only as indicated by the scope of the claims appended hereto.

We claim:

1. In-line scan control apparatus for testing a digital system of the type including a plurality of elemental memory units, certain of the memory units being selectively configurable in response to assertion of a scan signal to form a number of extended serial shift register means, each extended shift register means having an input terminal and an output terminal, the scan control apparatus comprising:

memory means for storing high level instructions and data;

scan control means coupled to the memory means by a high level data bus and operable in response to high level instructions received from the memory means to produce a number of test signals, including the scan signal, the scan control means including pattern generating means having n bit locations for sequentially generating test patterns;

first bit level means coupling at least individual ones of the n bit locations of the pattern generating means to the input terminals of corresponding extended shift register means; and second bit level means coupling the output terminals of the extended shift register means to the scan control means;

wherein the scan control means operates to cause the extended shift register means to conduct the bit patterns generated by the pattern generating means from the input terminals to the output terminals, and to store data received from the second means in the memory means.

2. The apparatus of claim 1, wherein the second means includes means for compressing the bit patterns conducted through the extended shift register means, the compressed bit patterns being stored in the memory means by the scan control means.

3. The apparatus of claim 1, wherein the second means includes cyclic redundancy checking means for compressing the bit patterns conducted through the extended shift register means, the compressed bit patterns being stored in the memory means by the scan control means.

4. The apparatus of claim 1, including means coupled to the scan control means, and operable to control the scan control means to download the instructions and data through the scan control means for storage in the memory means.

5. The apparatus of claim 1, the test pattern generating means being operable to generate pseudo-random test patterns.

6. The apparatus of claim 1, the first means being operable to couple respective ones of the n-bit positions of the pattern generator means to the input terminals of the corresponding ones of the extended shift register means.

7. The apparatus of claim 1, wherein the test signals include a HOLD signal, and wherein each of the certain elemental memory units is structured to respond to assertion of the HOLD signal to enter a state for holding data unchanged until deassertion of the HOLD signal.

8. The apparatus of claim 7, including register means for each of the number of extended shift register means for receiving and storing selection data from the scan control means including a number of test signals, and logic means for generating the HOLD signal in response to assertion of a predetermined one of the number of test signals and a predetermined state of the data.

9. The apparatus of claim 7, including means responsive to the scan control means for individually selecting one or more of the extended shift register means for receipt of the asserted HOLD signal.

10. The apparatus of claim 9, including register means for receiving selection data for each of the extended shift register means, and logic means coupled to the register means to receive the selection and at least one of the number of test signals to produce the HOLD signal for each of the extended shift register means.

11. The apparatus of claim 1, wherein each of the certain of the memory units are structured to have a data input for receiving digital system data thereat, a scan data input, a scan enable input for receiving a scan signal thereat, and a data output, the extended shift register means being formed by pluralities of the certain memory units having their scan data inputs coupled to receive the data output of a preceding certain memory unit, each of the certain memory units being operable to respond to the scan data signal to disregard the data input and accept data from the scan data input.

* * * * *